United States Patent [19]
Yamanaka

[11] Patent Number: 5,837,616
[45] Date of Patent: Nov. 17, 1998

[54] DRY ETCHING METHOD FOR ALUMINUM ALLOY AND ETCHING GAS THEREFOR

[75] Inventor: Michinari Yamanaka, Osaka, Japan

[73] Assignee: Matsushita Electric Industrial Co., Ltd., Japan

[21] Appl. No.: 787,352

[22] Filed: Jan. 22, 1997

[30] Foreign Application Priority Data

Jan. 22, 1996 [JP] Japan ................................ 8-008525

[51] Int. Cl.⁶ .................................................. H01L 21/302
[52] U.S. Cl. .......................... 438/735; 438/742; 252/79.2
[58] Field of Search ................... 252/79.1, 79.2; 438/712, 742, 735

[56] References Cited

U.S. PATENT DOCUMENTS

| | | | |
|---|---|---|---|
| 3,994,793 | 11/1976 | Harvilchuck et al. | 204/192 |
| 4,073,669 | 2/1978 | Heinecke et al. | 156/643 |
| 4,308,089 | 12/1981 | Iida et al. | 156/643 |
| 4,734,157 | 3/1988 | Carbaugh et al. | 156/643 |
| 5,024,722 | 6/1991 | Cathey, Jr. | 156/643 |
| 5,200,031 | 4/1993 | Latchford et al. | 156/659.1 |
| 5,372,969 | 12/1994 | Moslehi | 437/195 |
| 5,539,256 | 7/1996 | Mikagi | 257/763 |

FOREIGN PATENT DOCUMENTS

| | | |
|---|---|---|
| 0 485 802 A1 | 5/1992 | European Pat. Off. . |
| 41 24 543 | 3/1992 | Germany . |
| 6-131628 | 5/1994 | Japan . |

*Primary Examiner*—R. Bruce Breneman
*Assistant Examiner*—George Goudreau
*Attorney, Agent, or Firm*—Parkhurst & Wendel

[57] ABSTRACT

In a dry etching method of aluminum (Al) alloy film comprising the steps of (1) forming an alloy film of which a major component is Al on a semiconductor substrate, (2) forming a resist pattern on the alloy film, and (3) dry etching the alloy film using the resist pattern as a mask with etching gas to which ammonia gas is added, a flow rate of the ammonia gas being set at between not less than half of a flow rate of the etching gas and not more than the flow rate of the etching gas. Improved fine pattern dry etching of Al alloy including Si and Cu is achieved.

10 Claims, 6 Drawing Sheets

| FLOW RATIO OF NH₃ (%) | 0 | 9 | 11 | 20 | 33 | 39 | 43 |
|---|---|---|---|---|---|---|---|
| SHAPE OF ETCHED Al ALLOY FILM | ✕ | ✕ | △ | △ | ◯ | ◯ | ◯ |
| MICRO-LOADING EFFECT | ✕ | △ | △ | ◯ | ◯ | ◯ | ◯ |
| RESIDUES OF ETCHING | ✕ | ✕ | ✕ | △ | ◯ | ◯ | ◯ |

◯: EXCELLENT
△: FINE
✕: NO GOOD

FIG. 2

| FLOW RATIO OF NH$_3$ (%) | 0 | 9 | 11 | 20 | 33 | 39 | 43 |
|---|---|---|---|---|---|---|---|
| SHAPE OF ETCHED Al ALLOY FILM | ✕ | ✕ | △ | △ | ◯ | ◯ | ◯ |
| MICRO-LOADING EFFECT | ✕ | △ | △ | ◯ | ◯ | ◯ | ◯ |
| RESIDUES OF ETCHING | ✕ | ✕ | ✕ | △ | ◯ | ◯ | ◯ |

◯: EXCELLENT
△: FINE
✕: NO GOOD

DRY ETCHING METHOD FOR ALUMINUM ALLOY AND ETCHING GAS THEREFOR

BACKGROUND OF THE INVENTION

The present invention relates to a dry etching method for a metal film of aluminum (Al) alloy.

Aluminum is widely used as a wiring material for interconnection in semiconductor integrated circuits (ICs) by metalization and etching on a wafer. However, in order to restrain spikes and electro-migration due to fine wiring, Silicon (Si) or Copper (Cu) is added to Al to provide Al alloy. When dry etching such an Al alloy film, mixed gas comprising Boron Trichloride ($BCl_3$), Chloride ($Cl_2$), Chloroform ($CHCl_3$) and Nitrogen ($N_2$) has been used as etching gas. To achieve under-cut-free and side-etch-free dry etching of Al alloy, a method of forming a protective film is generally used in which a resist reaction product is attached to a side wall of the Al alloy film to form, by sputtering, a protective film thereon.

Nevertheless, the following problems occur in high density semiconductor ICs such as 64M DRAM and 256M DRAM that have been recently commercialized. A thickness of photo-resist film becomes thinner due to a shallowing depth of focus in a photo-resist process, and an area on which the resist is formed becomes smaller due to the finer wiring inherent in such devices. Specifically, a film thickness of photo-resist is no more than 1.0 $\mu$m and a wire width and thickness of Al alloy film are as fine as no more than 0.4 $\mu$m and 0.65 $\mu$m in the above DRAMs.

FIG. 5 is a schematic drawing of a cross sectional view of etched Al alloy wiring using etching gas comprising $BCl_3$ and $Cl_2$. Element 1 is a substrate such as Si and 4 is photo-resist. FIG. 5 shows under-cutting in the Al alloy wiring 2 because less reaction product of the resist is formed due to less overall area on which the resist can be formed. There are two ways to solve this problem: make the etching gas extremely high in ion-energy or add nitrogen gas to the etching gas. Both ways increase the reaction product by encouraging fragmentation of the resist pattern. In particular, etching gas with high ion-energy strongly attacks the photo-resist. Similarly, the added nitrogen gas accelerates the reaction between the etching gas and photo-resist.

However, a problem occurs when using the above noted solutions. In particular, an upper edge of the Al alloy wiring is etched. FIG. 6 is a schematic drawing of a cross sectional view of an experimental etching result using mixed gas comprising $BCl_3$ and $Cl_2$ to which nitrogen gas is added. It is found that an upper edge of the Al alloy wiring 2 is etched. Accordingly, these two solutions cannot increase selectivity. Selectivity is defined as the etching rate of Al alloy film divided by the etching rate of resist. In order to prevent the above problem when thin resist is used, the selectivity must be increased.

Recently a method of adding ammonia gas to etching gas (Japanese laid-open patent HO1-186622) has been tested. The addition of ammonia gas increases selectivity. The use of an oxide film instead of resist (Japanese laid-open patent HO5-206082) has also been tested.

However, a serious problem still remains even when these methods are used: silicon and copper are not highly accurately chemically etched when using mixed gas comprising $BCl_3$, $Cl_2$, $CHCl_3$ and $N_2$ for etching Al alloy films including Si and Cu. Thus, some residue remains.

FIG. 7 is a schematic drawing of a cross sectional view of an etched Al alloy film including Cu and Si by using gas to which ammonia gas is added. In this experiment, a flow rate of ammonia gas is a quarter of a flow rate of the mixed gas comprising $BCl_3$ and $Cl_2$. FIG. 7 shows that a large number of residues 5 are produced.

The residues resulting from ammonia-enriched gas etching emerges as a serious problem to achieving finer wiring. Thus, this problem prevents the method of adding ammonia gas from being introduced in a manufacturing process of semiconductor ICs.

SUMMARY OF THE INVENTION

An object of the present invention is to provide a dry etching method for achieving finer wiring which requires accurate etching of Al alloy film including Si and Cu, and to improve the manufacturing process of semiconductor ICs.

In a dry etching method including the steps of: (1) forming an alloy film of which a major component is Al, on a semiconductor substrate, (2) forming a resist pattern on the alloy film, and (3) dry etching the alloy film by using the resist pattern as a mask with an etching gas to which ammonia gas is added, the present invention employs a flow rate of the ammonia gas of not less than half of the flow rate of the etching gas, and not more than the flow rate of the etching gas.

According to the present invention, when using Al alloy film including Si and Cu, Al alloy film is dry etched in a fine pattern without worrying about residues. The method is explained next.

Adding ammonia gas within a specified range effectively forms aluminum nitride (AlN) on the Al surface thereby etching the Al alloy film through a mechanism comprising ion assist etching.

Thus, a difference between an etching rate on an exposed Al part and that of an exposed Si and Cu part becomes smaller, and production of residues is suppressed.

Therefore, even in a fine pattern of metal film having a wire width of not more than 0.4 $\mu$m as well as a film thickness of around 0.65 $\mu$m, an accurate metal film pattern can be formed, and thus a high density semiconductor IC such as a 64M DRAM or a 256M DRAM can be manufactured with a high yield rate.

BRIEF DESCRIPTION OF THE DRAWINGS

FIG. 2 is a chart summarizing experimental results of a shape of etched Al alloy film, the micro-loading effect, and residues of etching for various flow rate ratios of ammonia.

DESCRIPTION OF THE PREFERRED EMBODIMENT

Figure 1A:
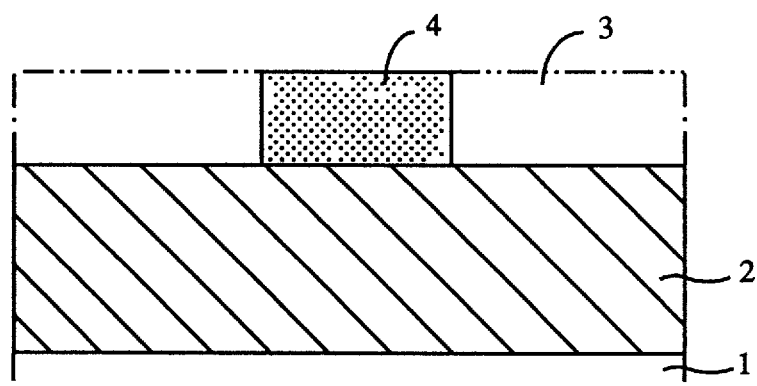
FIGS. 1a–b are schematic drawings of a cross sectional view of an Al alloy film before and after being dry etched according to an embodiment of the present invention.

As shown in FIG. 1a, first an Al alloy film 2 including 1% of Si and 0.5% of Cu with a film thickness of around 0.65

μm is formed on a semiconductor substrate 1, such as a substrate made of single crystal Si. Then, a photo-resist film 3 having a film thickness of not more than 1.0 μm is formed on the surface of the Al alloy film. Next, a resist pattern 4 having wire widths of not more than 0.4 μm is formed in photo-resist film 3 through a photo-lithography process.

Figure 1B:
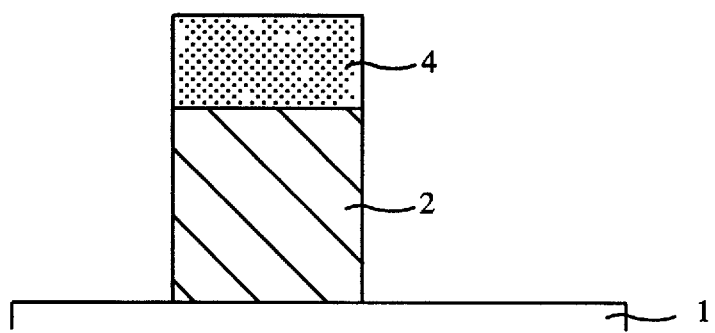

On the semiconductor substrate 1 on which the resist pattern 4 has been formed, an Al alloy film pattern is formed by dry etching under the following conditions:

1. Flow rate ratio of ammonia gas is 33% of that of the total gas (mixed gas of $BCl_3$, $Cl_2$ and $NH_3$.)
2. Etching apparatus is a Reactive Ion Etching type.
3. Wafer temperature: 70° C.
4. $BCl_3$ flow rate: 50 standard cubic centimeters per minute (sccm)
5. $Cl_2$ flow rate: 50 sccm
6. $NH_3$ flow rate: 50 sccm
7. Pressure: 200 mTorr
8. RF electric power: 250 W As FIG. 1(*b*) depicts, an excellent shape of Al wiring is obtained, and neither under-cut nor side etching is observed. In addition, etching of the upper edge of the Al wiring does not occur.

To compare with this example, another etching process is tested wherein the flow rate of ammonia is changed, and the etched Al alloy film is observed in cross section. As a result, a substantial correlation between the flow rate of ammonia gas and the section of etched Al alloy film is found. Namely, it proves that simply adding ammonia gas does not produce an improved etched structure.

FIG. 2 summarizes experimental results of a shape of etched Al alloy film, micro-loading effect, and residues of etching for various flow rates of ammonia. The flow-rate-ratio in FIG. 2 is defined as follows:

Flow-rate-ratio=flow rate of ammonia gas divided by a total flow rate of the etching gas and ammonia gas, where the etching gas is a mixed gas of $BCl_3$ and $Cl_2$. Other conditions are as follows:

Wafer temperature: 70° C.
Pressure: 200 mTorr
RF electric power: 250 W
$BCl_3$ flow rate: 50 sccm
$Cl_2$ flow rate: 50 sccm
$NH_3$ flow rate: 10, 12.5, 25, 50, 64, and 75 sccm The chart in FIG. 2 shows that the residues of etching do not occur when the flow rate ratio of ammonia gas is not less than 33%. In other words, by adding ammonia gas in such a large volume to the etching gas such that the ammonia gas comprises more than half of the etching gas, the problem of residues can be solved.

A mechanism of eliminating the residues is described herein below. The residues are produced because Cu and Si included in Al are not chemically etched by the etching gas (e.g. mixed gas of $BCl_3$ and $Cl_2$). When ammonia gas is added in a large volume, AlN is formed on the Al surface. Since AlN reacts poorly with the etching gas, the etching by chemical reaction progresses slowly. In this case, AlN is etched mainly though ion (existing in plasma) assist etching. When the ion assist etching dominates an etching process as above, an etching rate difference between the exposed Al part and the exposed Si and Cu parts decreases. Namely, occurrence of residues is suppressed at a threshold where the etching is transformed from chemical etching to ion assist etching.

The existence of a threshold has, heretofore, not been recognized because ion assist etching requires the addition of a large volume of ammonia. The inventor of the present invention has found that the threshold exists at a half of the flow rate of etching gas.

Figure 3:
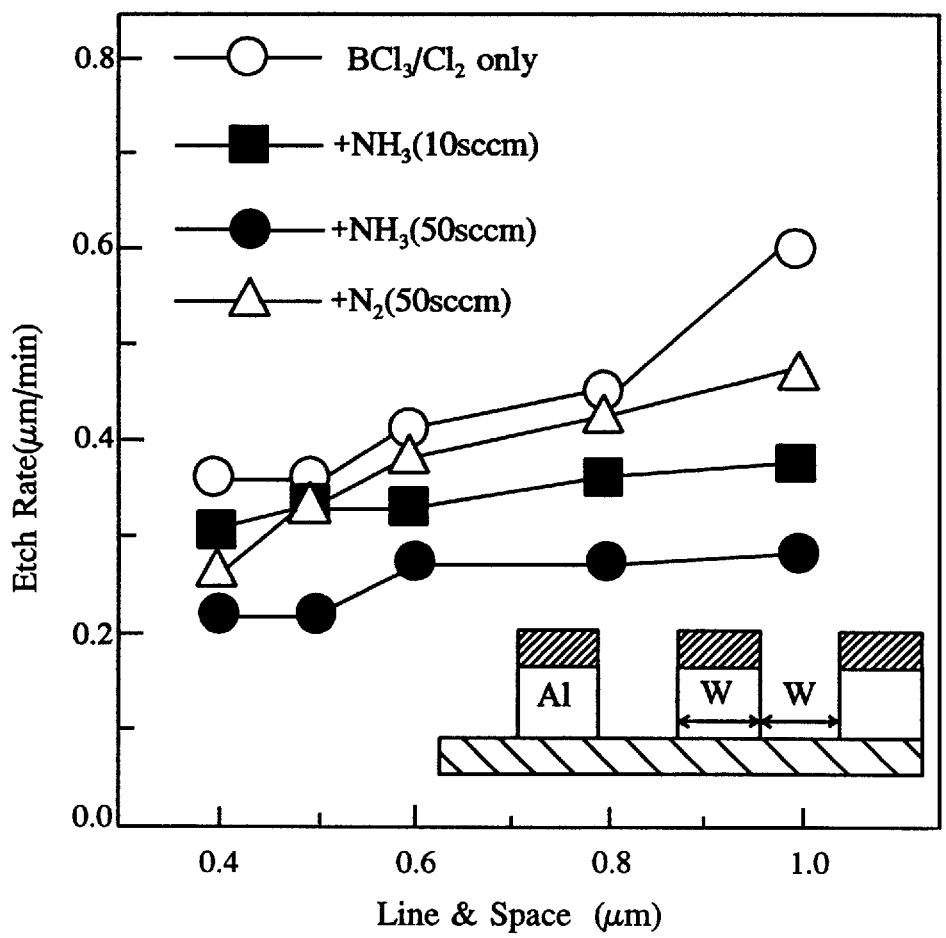
FIG. 3 is a graph showing experimental results of etching rate as a function of a pattern width for various types of gas.

FIG. 3 shows experimental results of etch rates, and indicates that adding ammonia gas is not favorable from the viewpoint of etch rate. In FIG. 3, the X axis represents Line and Space corresponding to a width of the mask pattern 4 when the mask pattern and the space pattern are alternately arranged sequentially to form a zebra pattern, where the width (w) of the mask (Line) pattern equals the width (w) of the Space.

As FIG. 3 shows, an etch rate substantially decreases due to adding the ammonia gas. On the other hand, the etch rate decreases less when nitrogen is added. When the etch rate decreases, etching time increases, thus productivity is lowered in a manufacturing process. This is the reason why ammonia gas has not been added in a large volume. Productivity is a key factor in the manufacturing process of semiconductors, and in particular, an etch rate of 0.2 μm/min is preferably needed.

The inventor has discovered that the maximum volume of added ammonia gas shall be selected such that the flow rate of ammonia gas is not more than the flow rate of etching gas in order to maintain reasonable productivity.

Therefore, in order to etch Al alloy film without hindering the manufacturing process, the volume of ammonia gas shall be added such that the flow rate of ammonia gas is not less than half, but not more than, the flow rate of etching gas.

In the fabrication process of semiconductor ICs, it is preferred that a gas cylinder, filled with an etching gas to which ammonia gas is added, is prepared. Here, the volume ratio of the ammonia gas is between not less than half of a volume ratio of etching gas such as $BCl_3$, $Cl_2$, etc. and not more than the volume ratio of the etching gas, where the volume ratio is a volume ratio when the etching gas and added ammonia gas is released from the gas cylinder (not a volume ratio when the etching gas is liquified in a gas cylinder).

The present invention also tends to decrease the micro-loading effect. The micro-loading effect refers to the effect wherein an etch rate of a metal film varies with a density of the resist pattern. In other words, a sparse resist pattern results in a fast etch rate, and a dense resist pattern results in a slow etch rate. Therefore, the smaller the micro-loading effect, the more uniform etching can be produced regardless of the density of a resist pattern. A fine pattern can thus be formed with ease.

The micro-loading effect, in general, is caused by the following three reasons:

(1) Radical distribution depends upon pattern. The more dense a resist pattern becomes, the fewer radicals are supplied to a substrate, and thus, the etch rate is reduced.

(2) Reaction product of the resist depends upon the pattern. The more dense the resist pattern becomes, the more reaction product yielded from photo-resist on the substrate, and thus the etch rate is reduced.

(3) An incident angle of an ion depends upon the pattern. When the resist pattern is dense, the etch rate is slower because only a small incident angle of the ion allows the ion to reach the substrate.

In the case of Al alloy film etching, the above reasons (1) and (2) are the major causes.

The micro-loading effect in forming a fine metal film pattern wherein a wire width is not more than 0.4 μm and a wire thickness is around 0.65 µm hampers the fine pattern forming because the effect becomes too serious.

In the conventional dry etching method, in particular, in order to protect the side-wall shape of the etching by attaching a reaction product to the side wall of the wire pattern, it is not possible to control production volume of reaction product from the photo-resist at a stable level regardless of the density of the resist pattern. Moreover, the etch rate is slow with dense patterns because an incidental volume of radicals is small. Due to these factors, the micro-loading effect cannot be reduced.

Furthermore, in the conventional etching method, since a high reactivity is expected between a Cl radical and Al, thermal reaction occurs. Even if ammonia gas is added, when a flow rate thereof is small, sufficient reduction cannot be expected in the micro-loading effect.

Figure 4:
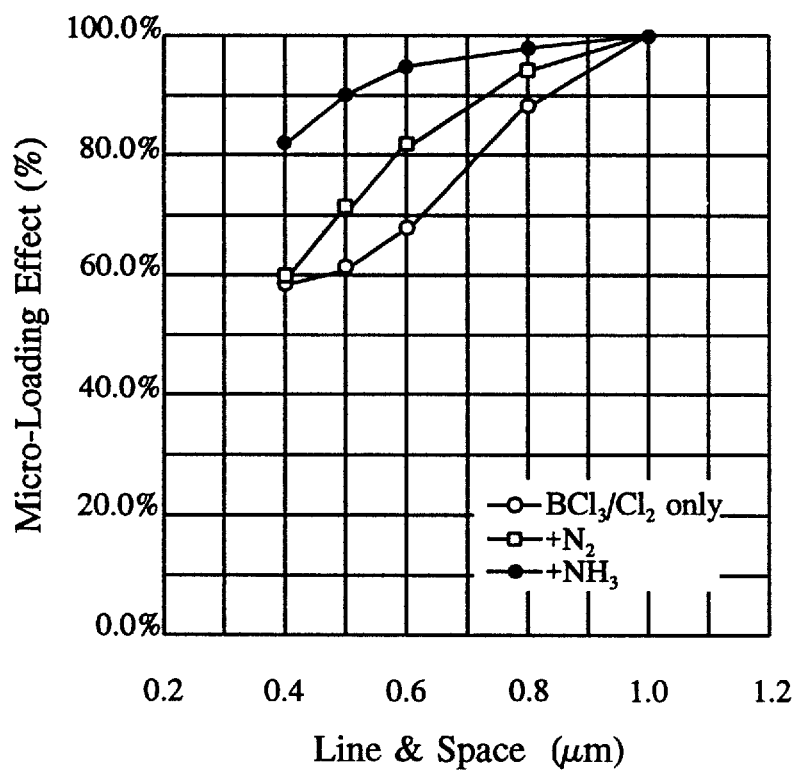
FIG. 4 is a graph showing experimental results of a micro-loading effect as a function of a pattern width for various types of gas.
Figure 5:
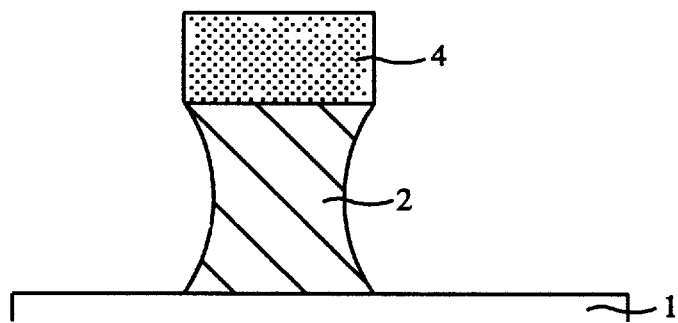
FIG. 5 is a schematic drawing of a cross sectional view of Al film dry etched by the mixed gas of $BCl_3$ and $Cl_2$.
Figure 6:
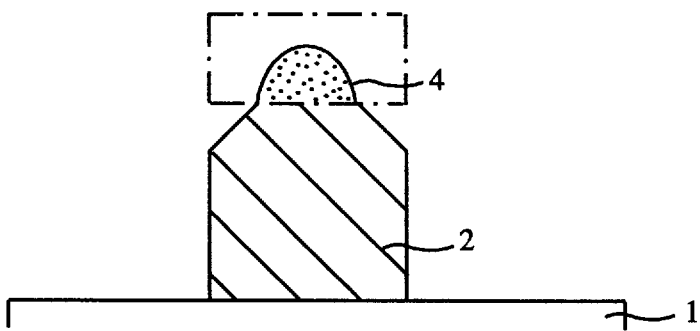
FIG. 6 is a schematic drawing of a cross sectional view of Al film dry etched by the mixed gas of $BCl_3$, $Cl_2$ and $N_2$.
Figure 7:
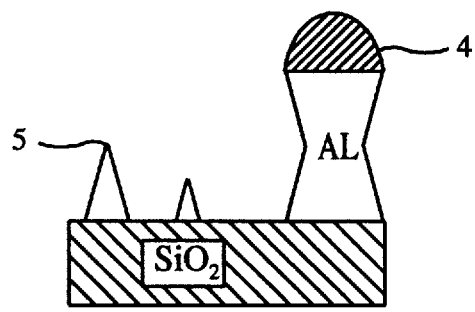
FIG. 7 is a schematic drawing of a cross sectional view of Al alloy film dry etched by the mixed gas of $BCl_3$, $Cl_2$ and $NH_3$.

FIG. 4 is a graph showing experimental results of the micro loading effect. The X axis represents Line & Space pattern and the Y axis represents the normalized micro-loading effect, i.e. etch rates are plotted under the condition of: 100% etch rate in 1.0 µm Line & Space pattern.

As FIG. 4 shows, the present invention has less etch rate dependency on the Line & Space pattern as compared to the case where ammonia gas is added sufficiently, thus the micro-loading effect is reduced substantially.

An etching process of dry etching according to the present invention is now detailed as follows to clarify why the micro-loading is reduced.

When adding ammonia gas, ions or radicals occur in plasma from etching gas. $NH_3$ gas causes the production of ions or radicals of $NH_2^+$, $NH^+$, etc., while $BCl_3$ gas and $Cl_2$ gas cause the production of ions or radicals of $BCl_2^+$, $Cl^+$, etc.

When supplying etching gas including such ions or radicals to the semiconductor substrate 1, first, the ions or radicals of smaller mass such as $NH_2^+$ and $NH^+$ (including an N atom) react with the Al alloy film 2. Thus, an AlN layer is first formed on the surface of Al alloy film 2 where the etching gas is supplied.

After the AlN layer is formed on the surface of Al alloy film 1, ions or radicals of greater mass such as $BCl_2$, Cl+, etc. form $AlCl_xN_y$ on the surface of the Al alloy film 2 by using ion assist. The $AlCl_xN_y$ vaporizes into etching product, and the etching progresses. At this moment, since the etching side wall is protected by the AlN layer previously formed, side etching is prevented. In other words, the layer protecting the etching side wall is not a reaction product formed by sputtering a resist pattern, but is produced by a reaction between the component (ions or radicals of $NH_2+$, NH+, etc.) of the etching gas and the Al alloy film 2.

Since such reactive ions or radicals of $NH_2+$, NH+, etc. have smaller masses, fragmenting reaction of resist pattern 4 by ion sputtering is suppressed compared to the case where $N_2$ gas is added. Thus, a fragmenting reaction of resist pattern 4 is suppressed, and the reaction product of resist pattern decreases. As a result, some density differences on the resist pattern 4 do not influence the production volume of reaction product from the resist pattern.

Moreover, since AlN of low reactivity is formed on the surface of the Al film, etching via chemical reaction is reduced, and thus etching via ion assist assumes the greater roll. As a result, thermal reaction between Cl radicals and Al decreases.

Therefore, the above-mentioned problems of (1) radical distribution depending upon a resist pattern, and (2) reaction product of the resist depending upon the pattern, are solved by the present invention. In other words, changes of production volume of reaction product from resist pattern due to the density difference of resist pattern 4 becomes smaller, and the etch rate variation, a major cause of which is the dependency of radical distribution on patterns, also becomes smaller, thereby reducing the micro-loading effect.

As shown in FIG. 2, in order to obtain sufficient decrease of the micro-loading effect, the flow rate ratio of ammonia gas shall be not less than 20%, for the sufficient effect cannot be expected without supply of a stable and more than a certain level of ammonia gas. The flow rate ratio of ammonia gas of the present invention is set at not less than 33% considering the residues. Thus, the micro-loading effect is effectively reduced.

In this embodiment, $BCl_3$ gas and $Cl_2$ gas are used as the etching gas. However, other types of gas can be used. For example, at least one of $SiCl_4$, $CHCl_3$, and HCl gases may be mixed as a chlorine system gas with $NH_3$, or at least one of $Br_3$, $Br_2$ and HBr gases may be mixed as a bromine system gas with $NH_3$.

Al alloy film 3 is used in this embodiment. However, the following metal films can be applied to the present invention.

When using a mixed gas of chlorine system gas and ammonia as the etching gas Al—Sc (Scandium) alloy, Ge (Germanium), Zr (Zirconium), W (Tungsten), Ag (Silver), Ti (Titanium), Mo (Molybdenum), Cu (Copper), and Au (Gold) can be used.

When using a mixed gas of bromine system gas and ammonia as the etching gas Al—Sc (Scandium) alloy, Ge (Germanium), Ag (Silver), Ti (Titanium), and Au (Gold) can be used.

When using a mixed gas of fluorine system gas and ammonia as the etching gas Ge (Germanium), W (Tungsten), Au (Gold), Ti (Titanium), and Ag (Silver) can be used.

As explained above, according to the present invention, Al alloy film including Si and Cu can be used for dry etching a fine pattern without producing etching residues. According to the method, ammonia gas is added within a specified quantity range, thereby forming AlN on the Al surface, and then the Al alloy film is etched using the mechanism comprising ion assist etching. Thus, the etching rate difference between an exposed Al part and an exposed Si and Cu part decreases. As a result, production of residues is suppressed.

What is claimed is:

1. A method of dry etching an Al alloy film, comprising the steps of:

forming the Al alloy film on a semiconductor substrate;

forming a resist pattern on the Al alloy film; and dry etching the Al alloy film using said resist pattern as a mask with a chlorine system gas to which ammonia gas is added, wherein a flow rate of said ammonia gas is between not less than half of a flow rate of said chlorine system gas and not more than the flow rate of said chlorine system gas and wherein AlN is formed on the Al alloy film during dry etching.

2. The dry etching method of claim 1, wherein said chlorine system gas includes at least one of $BCl_3$, $SiCl_4$, $Cl_2$, $CHCl_3$ and HCl gases.

3. The dry etching method of claim 1, wherein the Al alloy film comprises Cu.

4. The dry etching method of claim 1, wherein the Al alloy film comprises Si.

5. The dry etching method of claim 1, wherein the Al alloy film further comprises at least one of Cu and Si.

6. An etching gas, consisting essentially of:
a chlorine system gas including at least one of $BCl_3$, $SiCl_4$, $Cl_2$, $CHCl_3$ and HCl gases; and
an ammonia gas,
wherein a volume ratio of said ammonia gas is between not less than half of a volume ratio of said chlorine system gas and not more than the volume ratio of said chlorine system gas.

7. An etching gas comprising:
a bromine system gas; and
an ammonia gas,
wherein a volume ratio of said ammonia gas is between not less than half of a volume ratio of said bromine system gas and not more than the volume ratio of said bromine system gas.

8. The etching gas of claim 7, wherein said bromine system gas includes at least one of $BBr_3$, $Br_2$, and HBr gases.

9. A method of dry etching an alloy film, comprising the steps of:

forming the alloy film on a semiconductor substrate;

forming a resist pattern on the alloy film; and dry etching the alloy film using said resist pattern as a mask with a bromine system gas etching gas to which ammonia gas is added, wherein a flow rate of said ammonia gas is between not less than half of a flow rate of said etching gas and not more than the flow rate of said etching gas.

10. The dry etching method of claim 9, wherein said bromine system gas includes at least one of $BBr_3$, $Br_2$ and HBr gases.

* * * * *